United States Patent [19]
Kim

[11] Patent Number: 5,907,283
[45] Date of Patent: May 25, 1999

[54] POWER SUPPLY VOLTAGE DETECTING CIRCUIT FOR USE IN SEMICONDUCTOR MEMORY DEVICE

[75] Inventor: Chang-Rae Kim, Seoul, Rep. of Korea

[73] Assignee: Samsung Electronics, Co. Ltd., Suwon, Rep. of Korea

[21] Appl. No.: 08/683,638

[22] Filed: Jul. 15, 1996

[30] Foreign Application Priority Data

Jul. 14, 1995 [KR] Rep. of Korea .................. 95-20768

[51] Int. Cl.[6] .................................................. G08B 21/00
[52] U.S. Cl. .................... 340/661; 340/660; 365/226; 365/227
[58] Field of Search .................... 340/660, 661, 340/662, 663, 664; 364/226, 227, 228, 229

[56] References Cited

U.S. PATENT DOCUMENTS

| | | | |
|---|---|---|---|
| 4,800,533 | 1/1989 | Arakawa | 365/228 |
| 5,307,318 | 4/1994 | Nemoto | 365/226 |
| 5,426,616 | 6/1995 | Kajigaya et al. | 365/226 |
| 5,444,659 | 8/1995 | Yokokura | 365/189.09 |
| 5,592,423 | 1/1997 | Tokami | 365/221 |

*Primary Examiner*—Jeffery A. Hofsass
*Assistant Examiner*—Ashok Mannava
*Attorney, Agent, or Firm*—Marger Johnson & McCollom, P.C.

[57] ABSTRACT

A power supply voltage detecting circuit for preventing a current from being supplied to a chip in a stand-by state when a chip is not in operation, which is capable of being used even at a low power supply voltage. The power supply voltage detecting circuit for operating at a low power supply voltage includes a power supply voltage node whose output voltage varies as a function of an external power supply voltage, and a reference voltage node having a given voltage characteristic in accordance with the external power supply voltage. The circuit comprises: a differential amplifier which includes first and second N-type transistors and first and second P-type transistors, for comparing output voltages of the power supply voltage node and the reference voltage node; a fifth N-type transistor which has a gate connected with the reference voltage node; third and fourth N-type transistors, each connected with the fifth N-type transistor and having a gate regulated by a chip selection signal; a sixth N-type transistor having a gate regulated by an inverted chip selection signal; and a NOR gate, for finally outputting an output voltage of a logic low state at all times when a chip is in a stand-by state.

8 Claims, 2 Drawing Sheets

5,907,283

POWER SUPPLY VOLTAGE DETECTING CIRCUIT FOR USE IN SEMICONDUCTOR MEMORY DEVICE

BACKGROUND OF THE INVENTION

1. Field of the Invention

The present invention relates to a circuit in a semiconductor memory device or chip, where an internal power supply voltage and an external power supply voltage are used and, in particular, to a power supply voltage detecting circuit for sensing a specific voltage level so that the reliability of a chip can be ensured for a long time at a high power supply voltage. The present application is based on Korean Application No. 20768/1995 which is incorporated herein by reference for all purposes.

2. Description of the Related Art

Generally, a semiconductor memory device operates by way of an internal power supply voltage (hereinafter, referred to as $IV_{cc}$) an external power supply voltage (hereinafter, referred to as $EV_{cc}$) and a control signal, and satisfies AC and DC characteristics of a product at a given power supply voltage interval thereof. Also, a power supply voltage detecting circuit capable of sensing a specific voltage level is necessarily required for enabling a circuit which operates over a specific voltage ($V_{cc}$ ext=6~8V) such as a burn-in test. However, the power supply voltage detecting circuit as described above does not ensure the reliability of the chip for a long time at a high power supply voltage.

Further, the voltage applied from the external power supply can be used to energize the semiconductor memory device or chip and the reliability of the chip can be maximized by using an internal voltage converter (hereinafter, referred to as IVC) which limits the internal power supply voltage $IV_{cc}$ having a given voltage level.

FIG is a circuit diagram illustrating a prior art power supply voltage detecting circuit for use in a semiconductor memory device and FIG. 2 is a wave form of the prior art power supply voltage detecting circuit as shown in FIG. 1.

With reference to FIGS. 1 and 2, the construction and the operation of the prior art power supply voltage detecting circuit will be explained in detail hereinafter.

The prior art power supply voltage detecting circuit, as illustrated in FIG. 1, comprises a reference voltage generator 10 having a given voltage characteristic depending on the external power supply voltage $EV_{cc}$. The reference voltage generator 10 outputs a reference voltage $V_{ref}$. A differential amplifier 100 compares and amplifies the reference voltage $V_{ref}$ and an output voltage $V_a$, wherein the output voltage $V_a$ and its output level are simultaneously varied with the external power supply voltage $EV_{cc}$ as shown by the graph in FIG. 2.

An explanation on the operation of the prior art power supply voltage detecting circuit will be briefly given below, The external power supply voltage $EV_{cc}$ is supplied to the reference voltage, generator 10, first and second P-type transistors 1 and 2, and first and second resistors 8 and 9. An output voltage $V_{out}$ of the differential amplifier 100 is then supplied to first and second inverters 6 and 7.

Furthermore, in accordance with the variation of the external power supply voltage $EV_{cc}$, the output voltage $V_a$ which simultaneously varies proportionally with its output level, can be seen in following expression:

$$V_a = EV_{cc} \times R_9/(R_8+R_9)$$

where $R_6$ is the resistance value of first resistor 8 and $R_9$ is the resistance value of second resistor 9 as shown in the circuit of FIG. 1.

As can be seen in the above expression, inasmuch as the output voltage $V_a$ in an external power supply voltage region I as set forth in FIG. 2 is lower than the outpost voltage $V_{ref}$ therein, when the output voltages $V_a$ and $V_{ref}$ are applied as inputs of the differential amplifier 100, the output voltage $V_{out}$ goes to a logic "low" state. Thus, when $V_a < V_{ref}$, then $V_{out}$="low" state.

Moreover, because the output voltage $V_a$ in an external power supply voltage region II, as set forth in FIG. 2, is higher than the output voltage $V_{ref}$ therein, the output voltage $V_{out}$ of the differential amplifier 100 goes to a logic "high" state of 5~7V. In this case, in the logic "high" state of the external power supply voltage $EV_{cc}$, a greater stress is applied to a gate of the first inverter 6 for as long as $V_a > V_{ref}$. As a result, the reliability of the chip may be reduced.

In addition, since this results in bias transistor 5 being switched on when the chip is not being used and consequently placed in a stand-by state, it results in a problem in that the current can flow at all times through transistor 5.

SUMMARY OF THE INVENTION

It is therefore an object of the present invention to provide a power supply voltage detecting circuit for preventing the current from flowing in a stand-by state when a chip is not being operated, thereby allowing the chip to be operated at even a low power supply voltage.

It is another object of the present invention to provide a power supply voltage detecting circuit for changing an output voltage of a differential amplifier from a logic "high" state of an external power supply voltage to a logic "low" state thereof, thereby reducing the stress applied to a component.

It is further another object of the present invention to provide a power supply voltage detecting circuit for improving the reliability of the chip.

Those and other objects can be achieved according to the present invention with a power supply voltage detecting circuit for operating at a low power supply voltage, including a power supply voltage node which, together with its output voltage level, varies simultaneously with the external power supply voltage, and a reference voltage node having a given voltage characteristic in accordance with the external power supply voltage, which is comprised of: a differential amplifier which includes first and second N-type transistors and first and second P-type transistors, for comparing output voltages of the power supply voltage node and the reference voltage node, thereby outputting the compared result; a fifth N-type transistor which has a gate connected with the reference voltage node and a source connected with a ground voltage; third and fourth N-type transistors, each of which has a source connected with a drain of the fifth N-type transistor and a gate where a chip selection signal for controlling the differential amplifier is applied; a sixth N-type transistor which has a drain connected with an output terminal of the differential amplifier, a source connected with the ground voltage, and a gate where the chip selection signal inverted by a first inverter is applied; second and third inverters for serving as delay units, each of which is connected with the drain of the sixth N-type transistor; and a NOR gate having the one terminal connected with an output terminal of the first inverter and the other terminal connected with an output terminal of the third inverter, for finally outputting an output voltage of a logic low state at all times when a chip is in a stand-by state.

BRIEF DESCRIPTION OF THE DRAWINGS

A more complete appreciation of this invention, and many of the attendant advantages thereof, will be readily apparent as the same becomes better understood by reference to the following detailed description when considered in conjunction with the accompanying drawings, in which like reference symbols indicate the same or similar elements components, wherein.

DETAILED DESCRIPTION OF THE PREFERRED EMBODIMENTS

Figure 2:
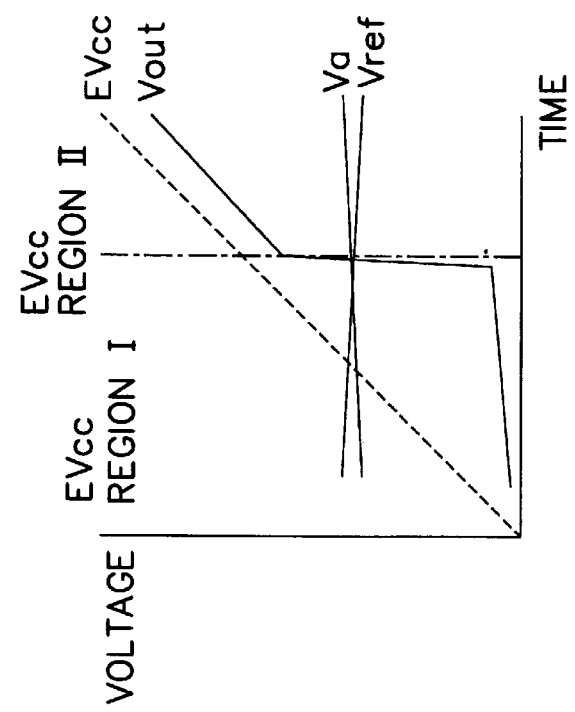
FIG. 2 is a wave form of the prior art power supply voltage detecting circuit as shown in FIG. 1.

Throughout the drawings, it is noted that the same reference numeral or letter will be used to designate like or equivalent elements having the same function. Further, in the following description, numerous specific details are set forth to provide a more thorough understanding of the present invention. It will be apparent, however, to one skilled in the art that the present invention may be practiced without these specific details. The detailed description on known function and constructions unnecessarily obscuring the subject matter of the present invention will be avoided in the present invention.

Figures 3, 4:
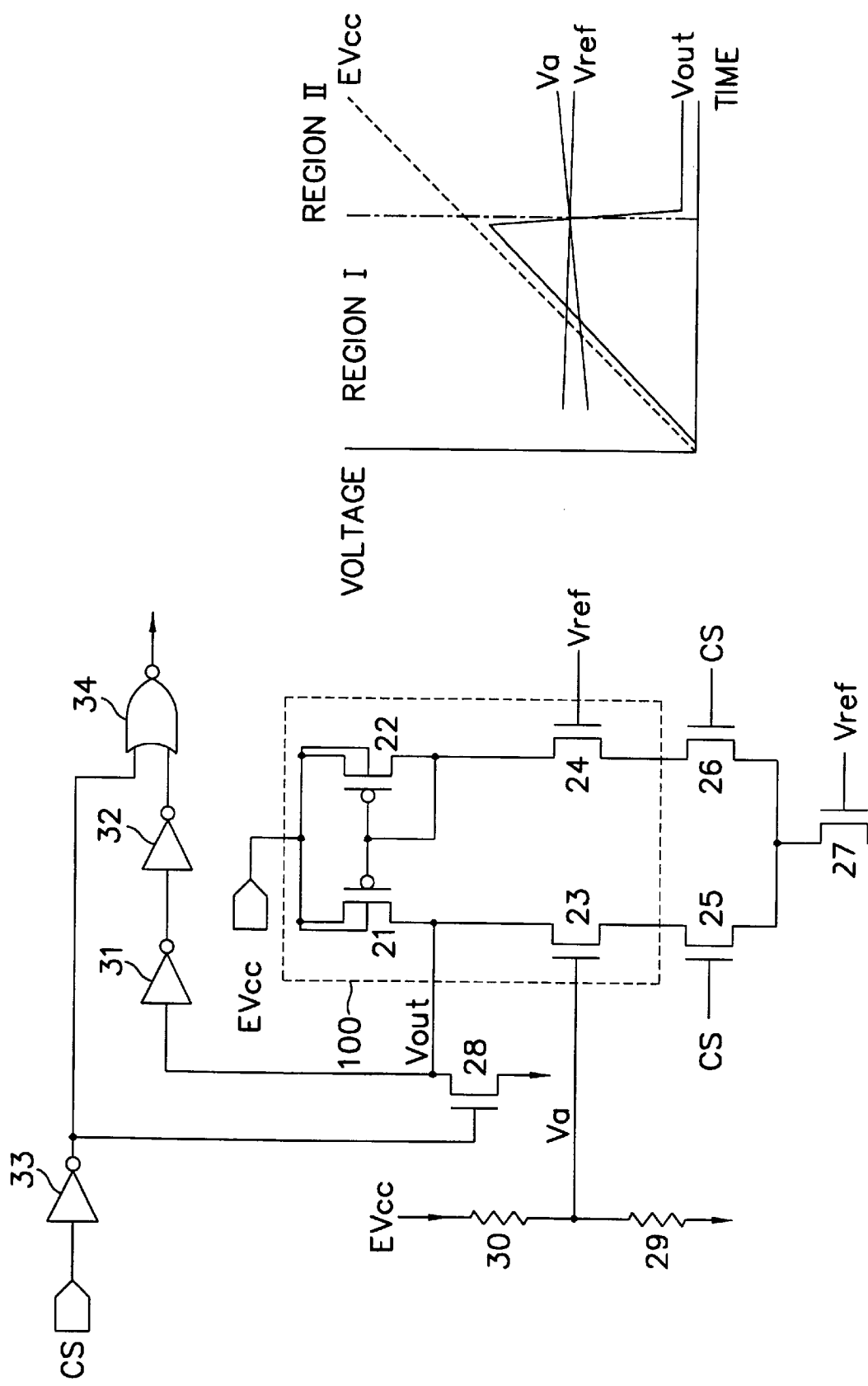
FIG. 3 is a circuit diagram illustrating a power supply voltage detecting circuit constructed according to the principles of the present invention.
FIG. 4 is a wave form of the power supply voltage detecting circuit as shown in FIG. 3.

FIG. 3 is a circuit diagram illustrating a power supply voltage detecting circuit constructed according to the principles of the present invention and FIG. 4 is a wave form of the power supply voltage detecting circuit as shown in FIG. 3.

Considering FIGS. 3 and 4, the construction and the operation of the power supply voltage detecting circuit according to the present invention will more concretely described hereinafter.

That is, the power supply voltage detecting circuit as shown in FIG. 3 is comprised of: a differential amplifier 100 which includes first and second P-type transistors 21 and 22 and first and second N-type transistors 23 and 24, for comparing an output voltage $V_a$ and a reference voltage $V_{ref}$, thereby outputting the compared result; a fifth N-type transistor 27 which has a gate connected with the reference voltage Vref and a source connected with a ground voltage; third and fourth N-type transistors 25 and 26, each of which has a source connected with a drain of the fifth N-type transistor 27 and a gate where a chip selection signal CS for controlling the differential amplifier 100 is applied; a sixth N-type transistor 28 which has a drain connected with an output terminal of the differential amplifier 100, a source connected with the ground voltage, and a gate where the chip selection signal CS, inverted by a first inverter 33, is applied; second and third inverters 31 and 32 for serving as delay units, each of which is connected with the drain of the sixth N-type transistor 28; and a NOR gate 34 having the one terminal connected with an output terminal of the first inverter 33 and the other terminal connected with an output terminal of the third inverter 32, for finally outputting an output voltage of a logic "low" state at all times when a chip is in a stand-by state.

The output voltage $V_a$ varied as the external power supply voltage $EV_{oc}$, corresponds to $V_a = EV_{cc} \times R_{29}(R_{29}+R_{30})$ where $R_{29}$ is the resistance value of first resistor 29 and $R_{30}$ is the resistance value of second resistor 30 as shown in FIG. 3. Namely, the output voltage $V_a$ is increased in proportion to the external power supply voltage $EV_{cc}$, $V_a = K \times EV_{cc}$ where X is some constant determined from the values of resistors 29,30. Here, the reference voltage $V_{ref}$ has a potential pertaining to a range of 1.5~2V.

First and foremost, in the stan d-by state where the chip is not selected, since the chip selection signal CS goes to the logic "low" state and the third and fourth N-type transistors 25 and 26 are turned off, the differential amplifier 100 does not operate. Accordingly, the first and second P-type transistors 21 and 22 are turned off and the sixth N-type transistor 28 is turned on, so that the output voltage $V_{out}$ can be maintained in a logic "low" state. Following that, an output of the first inverter 33 goes to the logic "high" state and an output of the third inverter 32 goes to the logic "low" state. Finally, a final output via the NOR gate 34 goes to the logic "low" state, thereby being capable of reducing the stress applied to the component.

In the case of selecting the chip, the chip selection signal CS goes to the logic "high" state and the third and fourth N-type transistors 25 and 26 are turned on, so that the differential amplifier 100 can operate normally. At this time, the output of the first inverter 33 goes to the logic "low" state and the sixth N-type transistor 28 is turned off.

In the power supply voltage region I as shown in FIG. 4, the output voltage $V_a$ has a potential lower than that of the reference voltage $V_{ref}$. This has the effect of increasing the amount of current which flows to the second, fourth and fifth transistors 24, 26 and 27 and decreasing the amount of current which flows to the first, third and fifth transistors 23, 25 and 27. Consequently, the potential of the output voltage $V_{out}$ goes to the logic "low" state.

With an increase of the external power supply voltage $EV_{cc}$ the output voltage $V_a$ is also increased. In the external power supply voltage region II, inasmuch as the output voltage $V_a$ has a potential higher than that of the reference voltage $V_{ref}$, the current amount which flows to the first, third and fifth transistors 23, 25 and 27 is increased, but the current amount which flows the second, fourth, and fifth transistors 24, 26 and 27 is decreased. (Consequently, the potential of the output voltage $V_{out}$ goes to the logic "low" state. Ultimately, the outputs of both the first inverter 33 and the third inverter 32 goes to the logic "low" state. As a result, the final output through the NOR gate 34 can go to the logic "high" state.

As may be apparent from the forgoing, the power supply voltage detecting circuit-according to the present invention has a good effect in that it can be operated even at a low power supply voltage by preventing the current from flowing through the chip when the chip is not in operation.

While there have been illustrated and described what are considered to be preferred embodiments of the present invention, it will be understood by those skilled in the art that various changes and modifications can be made, and equivalents can be substituted for elements thereof without departing from the true scope of the present invention. In addition, many modifications can be made to adapt a particular situation to the teaching of the present invention without departing from the central scope thereof. Therefore, it is intended that the present invention not be limited to the particular embodiment disclosed as the best mode contemplated for carrying out the present invention, but that the present invention includes all embodiments falling within the scope of the appended claims.

What is claimed is:

1. A power supply voltage detecting circuit for operating at a low power supply voltage, comprising:

a power supply voltage node which, together with its corresponding output voltage level, varies simultaneously with an external power supply voltage;

a reference voltage node having a given voltage characteristic in accordance with said external power supply voltage;

a differential amplifier which includes first and second N-type transistors and first and second P-type transistors, for comparing output voltages of said power supply voltage node and said reference voltage node, thereby outputting said compared result through an output terminal;

a fifth N-type transistor which has a gate connected with said reference voltage node and a source connected with a ground voltage;

third and fourth N-type transistors, each of which has a source connected with a drain of said fifth N-type transistor and a gate;

a first inverter;

a chip selection signal for controlling said differential amplifier, said chip selection signal being in communication with said first inverter and the gates of said third and fourth N-type transistors;

a sixth N-type transistor which has a drain connected with an output terminal of said differential amplifier, a source connected with said ground voltage, and a gate connected to said first inverter;

second and third inverters for serving as delay units, each of which is connected with said drain of said sixth N-type transistor; and a NOR gate having the one terminal connected with an output terminal of said first inverter and the other terminal connected with an output terminal of said third inverter, for finally outputting an output voltage of a logic low state at all times when a chip is in a stand-by state.

2. The circuit as recited in claim 1, wherein said third and fourth N-type transistors correspond to an N-type MOS transistors having its gate where said chip selection signal is applied.

3. The circuit as recited in claim 1, wherein said third and fourth N-type transistors control said differential amplifier, thereby preventing the current from flowing when the chip control signal designates a stand-by state.

4. A method for detecting a voltage level comprising:

receiving an external voltage from an external voltage source;

receiving a reference voltage;

receiving a chip selection signal, said signal corresponding to either a first or second logic state depending respectively whether an associated device is to be activated or not activated;

comparing the external voltage and the reference voltage;

outputting a logic state signal, said logic state signal corresponding to a first logic state if the reference voltage is greater than the external voltage, otherwise said logic state signal corresponding to a second logic state; and outputting a final signal of a logic low state if either said chip selection signal corresponds to the second logic state or said logic state signal corresponds to the first logic state, otherwise outputting a final output signal of a logic high state.

5. A method for preventing a current from being supplied to a chip in a stand by state when the chip is not in operation, comprising the steps of:

supplying a first voltage from a power supply voltage node to a differential amplifier;

supplying a second voltage from a reference voltage node to the differential amplifier;

comparing said first and second voltages within said differential amplifier to obtain a compared result;

outputting said compared result;

supplying a chip selection signal, said chip selection signal being determinative of whether said chip is to be energized or stand-by state;

operatively connecting a NOR gate to said chip selection signal and said compared result; and outputting a final output voltage of a logic low state at all times when a chip is in a stand-by state.

6. The method of claim 5 wherein said step of operatively connecting the NOR gate to said chip selection signal includes:

inverting said chip selection signal; and operatively connecting said inverted signal to said NOR gate.

7. The method of claim 5 wherein the step of operatively connecting the NOR gate to said compared result includes:

inverting for a first time said compared result;

inverting said first inverted compared result to obtain a second inverted compared result; and operatively connecting said second inverted result to said NOR gate.

8. A method for preventing a current from being supplied to a chip in a stand-by state when the chip is not in operation, comprising:

supplying a first voltage from an external voltage source to a differential amplifier;

supplying a second voltage to the differential amplifier;

supplying a chip selection signal to said differential amplifier, said chip selection signal corresponding to either a first or second logic state depending respectively whether said chip is to be energized or placed in a stand-by state;

said differential amplifier comparing said first and second voltages and generating a logic state signal;

said logic state signal corresponding to a first logic state if the second voltage is greater than the first voltage, otherwise said logic state signal corresponding to a second logic state; and a logic gate operatively connected between said chip selection signal and said logic state signal and generating a final signal;

whereby said logic gate outputs a logic low state as the final signal if either said chip selection signal corresponds to the second logic state or said logic state signal corresponds to the first logic state, otherwise outputting a logic high state as the final signal.

* * * * *

UNITED STATES PATENT AND TRADEMARK OFFICE
CERTIFICATE OF CORRECTION

Figure 1:
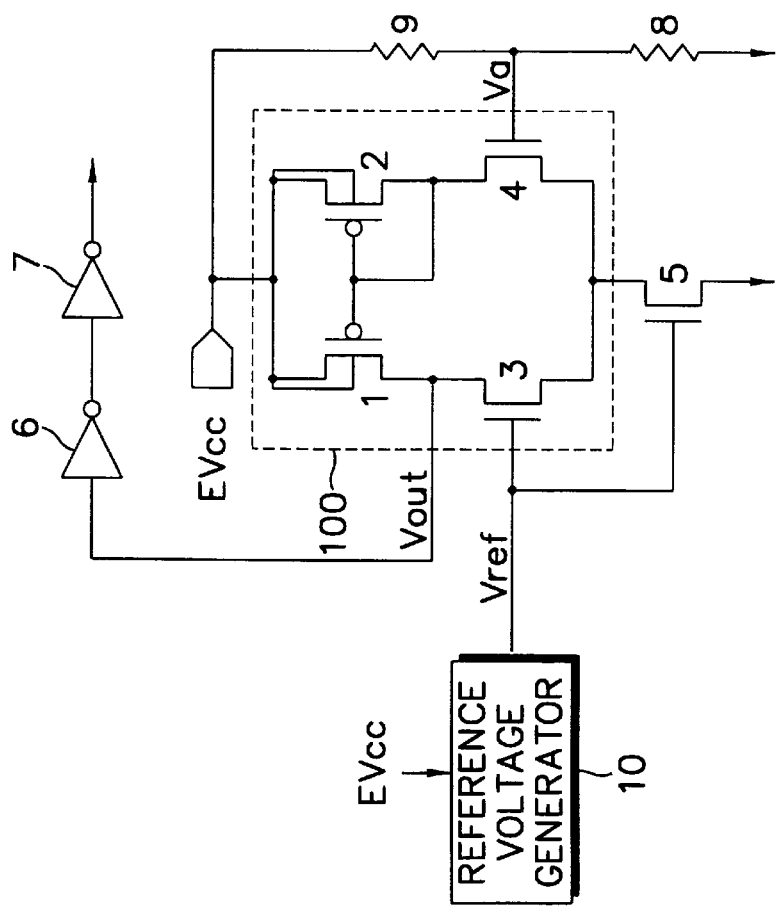
FIG. 1 is a circuit diagram illustrating a prior art power supply voltage detecting circuit for use in a semiconductor memory device.

PATENT NO.    : 5,907,283
DATED         : May 25, 1999
INVENTOR(S)   : Chang-Rae Kim It is certified that error appears in the above-identified patent and that said Letters Patent is hereby corrected as shown below:

Column 1,
Line 35, "FIG is a" should read -- FIG. 1 is a --;
Line 65, "where R6 is the" should read -- where R8 is the --;

Column 2,
Line 3, "outpost" should read -- output --;

Column 4,
Line 4, "where X is" should read -- where K is --; and
Line 43, "decreased. (Consequently," should read -- decreased. Consequently, --.

Signed and Sealed this

Fourth Day of February, 2003

JAMES E. ROGAN
*Director of the United States Patent and Trademark Office*